United States Patent
Nagarajan et al.

(10) Patent No.: US 9,961,799 B1
(45) Date of Patent: May 1, 2018

(54) APPARATUSES AND SYSTEMS FOR INCREASING THERMAL MASS IN LINE CARD HEATSINKS

(71) Applicant: Juniper Networks, Inc., Sunnyvale, CA (US)

(72) Inventors: Mahesh Nagarajan, Campbell, CA (US); Henry K. Sim, Mountain View, CA (US); John Kenney, Groton, MA (US); Brian J. Ray, Livermore, CA (US); Sriram Gopalaratnam, San Jose, CA (US); Gauri R. Khanolkar, Sunnyvale, CA (US); Olaf Moeller, Santa Clara, CA (US); Travis S. Mikjaniec, Fremont, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days. days.

(21) Appl. No.: 15/241,704

(22) Filed: Aug. 19, 2016

(51) Int. Cl.
| | |
|---|---|
| H05K 7/20 | (2006.01) |
| F28F 3/04 | (2006.01) |
| H05K 7/14 | (2006.01) |
| H05K 9/00 | (2006.01) |
| H04B 10/25 | (2013.01) |

(52) U.S. Cl.
CPC ........... *H05K 7/20409* (2013.01); *F28F 3/04* (2013.01); *H05K 7/1418* (2013.01); *H05K 7/20127* (2013.01); *H05K 9/0058* (2013.01); *H04B 10/25* (2013.01)

(58) Field of Classification Search
CPC ...... H05K 7/20409; H05K 7/1418; F28F 3/04
USPC ........................................................ 361/709
See application file for complete search history.

(56) References Cited

U.S. PATENT DOCUMENTS

| | | | | |
|---|---|---|---|---|
| 5,625,229 A | * | 4/1997 | Kojima ................... | F28F 3/025 257/712 |
| 5,943,456 A | * | 8/1999 | Buchholz ............. | G02B 6/4201 385/16 |
| 6,198,040 B1 | * | 3/2001 | Desousa .................. | H02G 3/14 174/375 |
| 7,804,684 B1 | * | 9/2010 | Aybay .................. | H05K 7/1445 312/236 |
| 8,144,458 B2 | * | 3/2012 | Vinson ................. | G11B 33/124 165/80.2 |
| 2005/0122691 A1 | * | 6/2005 | Crippen ............... | H05K 7/2049 361/719 |

* cited by examiner

*Primary Examiner* — Dion R Ferguson
*Assistant Examiner* — Mandeep S Buttar
(74) *Attorney, Agent, or Firm* — FisherBroyles, LLP

(57) ABSTRACT

The disclosed apparatus may include (1) a faceplate that facilitates at least one connection between at least one communication cable and a line card that forwards traffic in connection with a network, (2) at least one heatsink that (A) is integrated into the faceplate and (B) absorbs heat dissipated by at least one electronic component included in the line card, and (3) at least one mount that (A) is integrated into the faceplate and (B) enables the electronic component to attach to the heatsink. Various other apparatuses and systems are also disclosed.

18 Claims, 5 Drawing Sheets

US 9,961,799 B1

APPARATUSES AND SYSTEMS FOR INCREASING THERMAL MASS IN LINE CARD HEATSINKS

BACKGROUND

Network devices (such as routers) often include line cards that facilitate communication among computing devices within a network. In this context, the term "line card" typically refers to any type or form of Field-Replaceable Unit (FRU) with one or more ports and/or interfaces that enable a network device to forward traffic within a network and/or across multiple networks. For example, a router may include various Physical Interface Cards (PICs) and/or Flexible PIC Concentrators (FPCs) that facilitate communication among computing devices within a network and/or across multiple networks.

Traditional line cards may include various pieces and/or parts. For example, a traditional line card may include an optics module that receives and/or forwards traffic by way of fiber optic cabling. On one side, the optics module may attach to a Printed Circuit Board (PCB) that provides support and/or structure within the traditional line card. On another side, the optics module may attach to and/or make physical contact with a heatsink that absorbs heat generated by the optics module. In this example, the heatsink may attach to a faceplate that serves as a point of connection for the fiber optic cabling. In addition, the faceplate may attach to side rails that slide into a router and/or physically support the line card when installed.

Unfortunately, this traditional line card may have certain drawbacks and/or imperfections. For example, the traditional line card's heatsink may be unable to absorb sufficient heat from the optics module under certain conditions due at least in part to the heatsink's limited thermal mass. This inability to absorb sufficient heat may worsen as the performance of such optics modules increases and/or the amount of heat generated by such optics modules increases. The instant disclosure, therefore, identifies and addresses a need for apparatuses and systems for increasing thermal mass in line card heatsinks.

SUMMARY

As will be described in greater detail below, the instant disclosure generally relates to apparatuses and systems for increasing thermal mass in line card heatsinks. In one example, an apparatus for accomplishing such a task may include (1) a faceplate that facilitates at least one connection between at least one communication cable and a line card that forwards traffic in connection with a network, (2) at least one heatsink that (A) is integrated into the faceplate and (B) absorbs heat dissipated by at least one electronic component included in the line card, and (3) at least one mount that (A) is integrated into the faceplate and (B) enables the electronic component to attach to the heatsink.

Similarly, a faceplate for accomplishing this task may include (1) at least one communication port that facilitates securing at least one communication cable to a line card that forwards traffic in connection with a network, (2) at least one heatsink that absorbs heat dissipated by at least one electronic component included in the line card, and (3) at least one mount that enables the electronic component to attach to the heatsink.

Another apparatus for accomplishing this task may include (1) a faceplate that facilitates at least one connection between at least one communication cable and a line card that forwards traffic in connection with a network, (2) at least one heatsink that (A) is integrated into the faceplate and (B) facilitates absorbing heat dissipated by at least one electronic component included in the line card, (3) at least one mount that (A) is integrated into the faceplate and (B) enables the electronic component to attach to the heatsink, and (4) at least a portion of a side rail that (A) is integrated into the faceplate and (B) physically supports the line card when installed in a telecommunications device included in the network.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
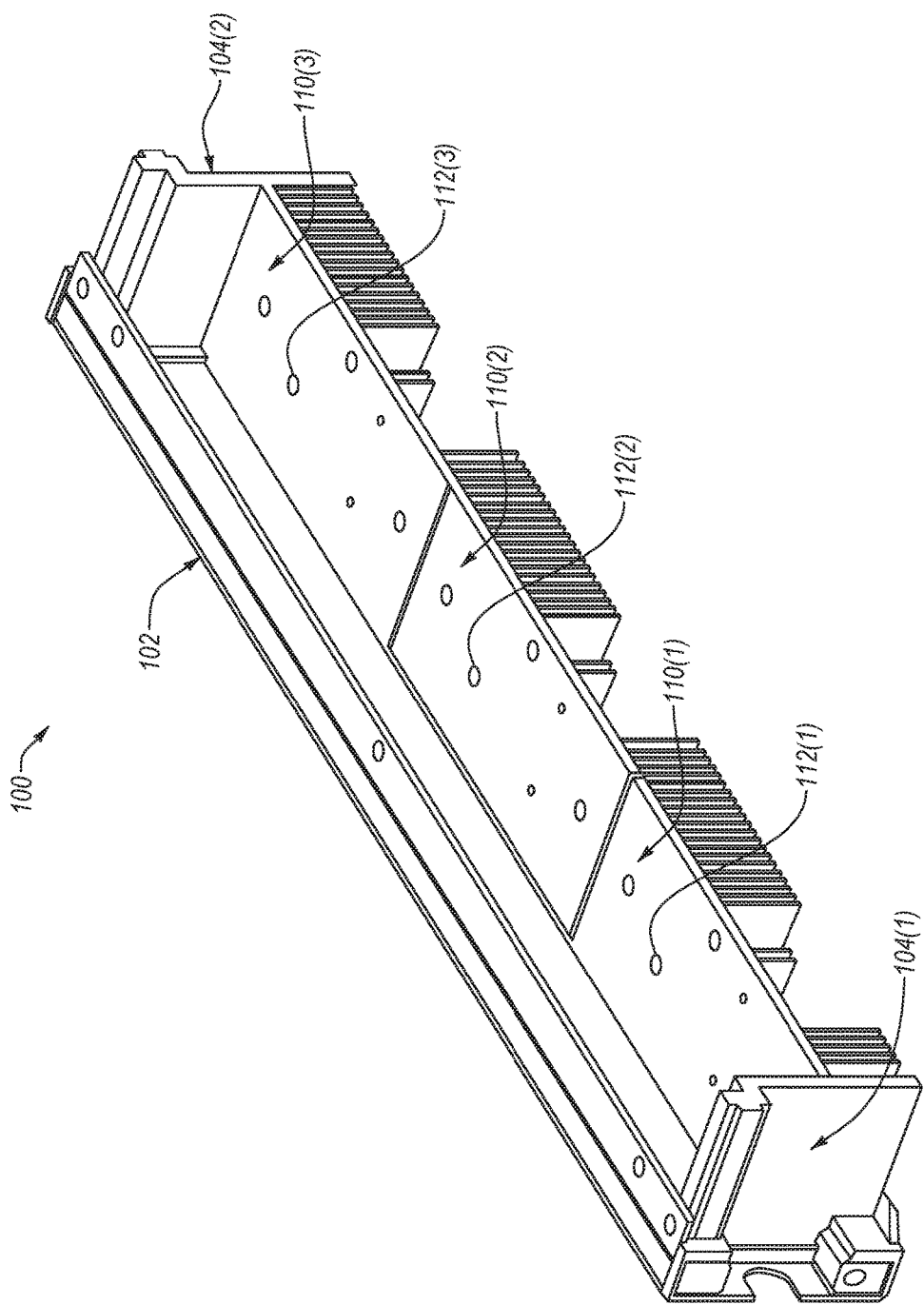
FIG. 1 is an illustration of an exemplary apparatus for increasing thermal mass in line card heatsinks.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses and systems for increasing thermal mass in line card heatsinks. As will be explained in greater detail below, embodiments of the instant disclosure may increase the thermal mass of a heatsink in a line card by integrating such a heatsink into the line card's faceplate such that heat absorbed by the heatsink dissipates throughout the faceplate. Accordingly, the heatsink and faceplate may form a single inseparable piece of the line card. In addition, by integrating the heatsink into the faceplate in this way, embodiments of the instant disclosure may reduce the cost of manufacturing and/or assembling the line card due at least in part to the decreased number of separate pieces and/or parts included in the line card.

Moreover, embodiments of the instant disclosure may further decrease the number of separate pieces and/or parts that are included in a line card. For example, some embodiments may integrate at least a portion of the side rails into the faceplate of a line card. In this example, the side rails may slide into a router and/or physically support the line card when installed in the router. By integrating the portion of the side rails into the faceplate in this way, embodiments of the instant disclosure may mitigate and/or eliminate ElectroMagnetic Interference (EMI) leaks that, in certain traditional line cards, sometimes form at gaps and/or spaces where the faceplate and side rails connect to one another.

The following will provide, with reference to FIGS. 1-5, detailed descriptions of exemplary apparatuses and corresponding implementations that decrease heat migration in ganged heatsinks. FIG. 1 shows a block diagram of an exemplary apparatus 100 that increases the thermal mass of line card heatsinks. The term "line card," as used herein, generally refers to any type or form of FRU with one or more ports and/or interfaces that enable a network device to forward traffic within a network and/or across multiple networks. Examples of line cards include, without limitation, Physical Interface Cards (PICs), Flexible PIC Concentrators (FPCs), Switch Interface Boards (SIBs), control boards, routing engines, communication ports, fan trays, connector interface panels, variations or combinations of one or more of the same, and/or any other suitable line cards.

The term "heatsink," as used herein, generally refers to any type or form of system, device, structure, and/or mechanism that conducts, transfers, absorbs, and/or sinks heat. Heatsinks may include and/or contain a variety of materials. Examples of such heatsink materials include, without limitation, copper, aluminum, copper, diamond, alloys of one or more of the same, variations or combinations of one or more of the same, and/or any other suitable materials.

FIG. 1 shows an exemplary apparatus 100 for achieving increased thermal mass in line card heatsinks. As illustrated in FIG. 1, apparatus 100 may include a faceplate 102. The term "faceplate," as used herein, generally refers to any type or form of external plate and/or cover of a line card. In one example, faceplate 102 may include and/or represent an external and/or outward-facing portion of a line card. In this example, the line card may have another portion and/or side that is designed to interface with and/or connect to a backplane of a telecommunications device (such as a router). Faceplate 102 may sit, reside, and/or be located on a side of the line card that is opposite the side designed to interface with and/or connect to the backplane. Accordingly, when the line card is installed and/or inserted in a telecommunications device (such as a router), faceplate 102 may be accessible and/or exposed.

In some examples, faceplate 102 may include one or more communication ports that receive, house, and/or hold one or more communication cables. For example, faceplate 102 may include a communication port designed to receive, house, and/or hold a fiber optic cable in connection with a line card. Accordingly, this communication port may represent and/or serve as a receptacle for connecting and/or securing the fiber optic cable to the line card. Additionally or alternatively, this communication port may effectively form a connection between the fiber optic cable and the line card. In this example, an administrator or assembler may plug a fiber optic cable into the communication port included in faceplate 102 to establish communication between the telecommunications device and at least one other device.

In some examples, faceplate 102 may serve as a point of contact for installing the corresponding line card in a telecommunications device and/or removing the corresponding line card from the telecommunications device. For example, an administrator or assembler may hold, press against, and/or pull on faceplate 102 when installing the line card in a router and/or removing the line card from the router. Faceplate 102 may also include one or more ejectors and/or ejection handles (in, e.g., the form of helical screws) that secure the line card to the telecommunications device. In this example, the administrator or assembler may secure the line card to the telecommunications device during installation by tightening and/or engaging the ejectors and/or ejection handles.

In some examples, apparatus 100 may also include one or more heatsinks. As illustrated in FIG. 1, apparatus 100 may include heatsinks 110(1), 110(2), and 110(3). In one example, heatsinks 110(1)-(3) may be integrated into the same piece and/or part of the line card as faceplate 102. In other words, heatsinks 110(1)-(3) and faceplate 102 may collectively form a single inseparable piece of the line card. Accordingly, heatsinks 110(1)-(3) and faceplate 102 may be manufactured together as a single inseparable piece of the line card. This integration of heatsinks 110(1)-(3) and faceplate 102 may effectively decrease the number of separate pieces and/or parts that are included in the line card (relative to a traditional line card). As a result, this integration of heatsinks 110(1)-(3) and faceplate 102 may reduce the cost of manufacturing and/or assembling the line card due at least in part to the decreased number of separate pieces and/or parts included in the line card.

In some examples, apparatus 100 may also include one or more mounts. The term "mount," as used herein, generally refers to any type or form of system, assembly, and/or mechanism that facilitates physically mounting, attaching, connecting, and/or interfacing an electronic component to a heatsink. Examples of such mounts include, without limitation, full or partial fasteners, fittings, receptacles, couplings, screw holes or assemblies, variations or combinations of one or more of the same, and/or any other suitable mounts.

In one example, an electronic component that attaches and/or connects to these mounts may include and/or represent an optics module that enables the line card to facilitate fiber-optic communication. Additional examples of such electronic components include, without limitation, optics modules, communication modules, circuitry, power conversion and/or regulation modules, PCBs, batteries, variations or combinations of one or more of the same, and/or any other suitable electronic components.

As illustrated in FIG. 1, apparatus 100 may include mounts 112(1), 112(2), and 112(3). In this example, mounts 112(1)-(3) may each include and/or represent one side of a fastener and/or assembly used to attach an electrical component to the line card. More specifically, mounts 112(1)-(3) may each facilitate fastening an electrical component to the corresponding heatsink within the line card.

In one example, mounts 112(1)-(3) may each be integrated into faceplate 102. For example, mounts 112(1)-(3) may be integrated into the same piece and/or part of the line card as faceplate 102 and heatsinks 110(1)-(3). Additionally or alternatively, mounts 112(1)-(3) may be positioned and/or located on heatsinks 110(1)-(3), respectively. Accordingly, mounts 112(1)-(3) may enable electronic components to attach to heatsinks 110(1)-(3), respectively.

In some examples, apparatus 100 may further include one or more side rails and/or portions of side rails. The term "side rail," as used herein, generally refers to any type or form of rail and/or slide that supports a line card within a telecommunications device by way of a sliding and/or track system. As illustrated in FIG. 1, apparatus 100 may include side rails 104(1) and 104(2). In this example, side rails 104(1)-(2) may each include and/or represent at least a portion of one side of a sliding and/or track system used to install and/or remove line cards within a telecommunications device. Side rails 104(1)-(2) may each enable the corresponding line card to be installed into the telecommunications device. Additionally or alternatively, side rails 104(1)-(2) may enable an administrator or assembler to slide the corresponding line card in and out of the telecommunications device as needed for installation and/or removal.

In one example, side rails 104(1)-(2) may each include and/or represent only a portion and/or segment of the entire corresponding side rail. For example, an administrator or assembler may add additional portions and/or segments to side rails 104(1)-(2) to extend to a certain length or as needed to accommodate a particular sliding and/or track system.

In some examples, the integration of side rails 104(1)-(2) and faceplate 102 may effectively prevent EMI from escaping from the line card in the direction of the faceplate. In other words, the integration of side rails 104(1)-(2) and faceplate 102 may mitigate and/or eliminate EMI leaks that, in certain traditional line cards, sometimes form at gaps and/or spaces where the faceplate and side rails connect to one another.

In some examples, faceplate 102, heatsinks 110(1)-(3), mounts 112(1)-(3), and side rails 104(1)-(2) may collectively form a single inseparable piece and/or member of the line card due at least in part to the above-described integration. Accordingly, faceplate 102, heatsinks 110(1)-(3), mounts 112(1)-(3), and side rails 104(1)-(2) may all be manufactured and/or produced together as a single inseparable piece and/or member of the line card.

In some examples, faceplate 102 may include and/or incorporate a cable management solution that physically supports any communication cables that are connected to the line card. In other words, a cable management solution may be integrated into faceplate 102 to prevent tangling and/or control how the communication cables hang from the line card.

In some examples, faceplate 102 may include at least one vent that enables ambient air to flow from outside of the line card to inside of the line card. This airflow may help cool and/or control the temperature of the electronics within the line card. Additionally or alternatively, this airflow may help cool and/or control the temperature of faceplate 102 whose temperature may increase due at least in part to the dispersion of heat transferred from the electronic components by way of heatsinks 110(1)-(3).

In some examples, heatsinks 110(1)-(3) may make physical contact with electronic components (such as optics modules) to facilitate absorbing heat generated by these electronic components. By absorbing such heat in this way, heatsinks 110(1)-(3) may effectively transfer at least a portion of the heat to faceplate 102. Accordingly, the heat may dissipate throughout heatsinks 110(1)-(3) and faceplate 102, thereby enabling the line card to maintain an overall lower temperature due at least in part to the increased thermal mass resulting from the integration of heatsinks 110(1)-(3) and faceplate 102.

Although not necessarily illustrated in FIG. 1, various other features may be built and/or incorporated into faceplate 102. Examples of such features include, without limitation, gaskets, gasket rails, ejector mounting, board aligners, variations or combinations of one or more of the same, and/or any other suitable features that may be built and/or incorporated into faceplate 102.

Figure 2:
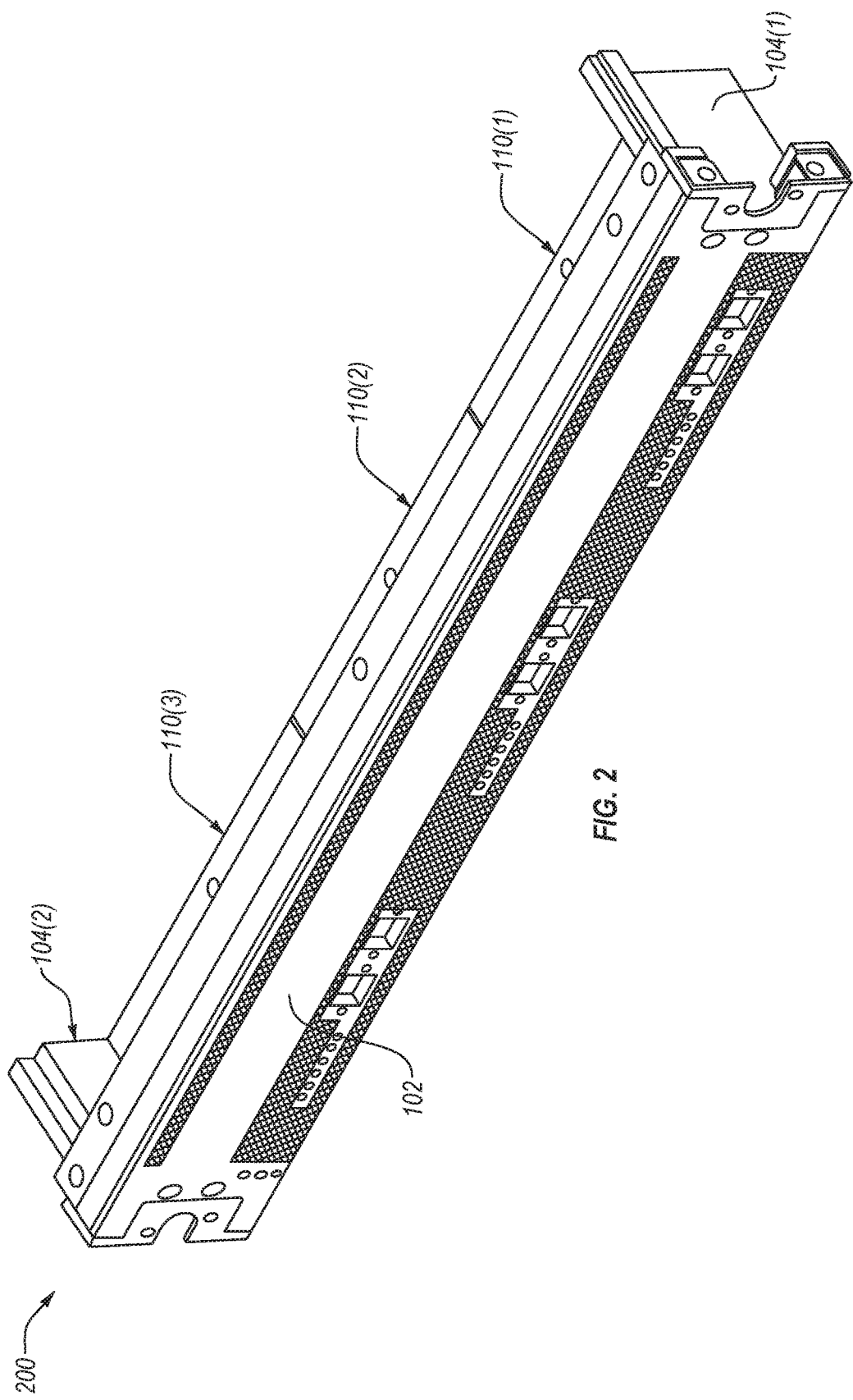
FIG. 2 is an illustration of an exemplary apparatus for increasing thermal mass in line card heatsinks.

FIG. 2 shows an exemplary apparatus 200 for achieving increased thermal mass in line card heatsinks. As illustrated in FIG. 2, apparatus 200 may include faceplate 102, heatsinks 110(1)-(3), and side rails 104(1)-(2). In this example, apparatus 200 may include and/or represent a single inseparable piece and/or member of a line card that incorporates faceplate 102, heatsinks 110(1)-(3), and side rails 104(1)-(2). Apparatus 200 may also include venting (not necessarily labeled in FIG. 2) that is embedded in faceplate 102 and enables ambient air to flow from outside of the line card to inside of the line card. In addition, apparatus 200 may include certain communication ports (not necessarily labeled in FIG. 2) that are incorporated in faceplate 102.

Figure 3:
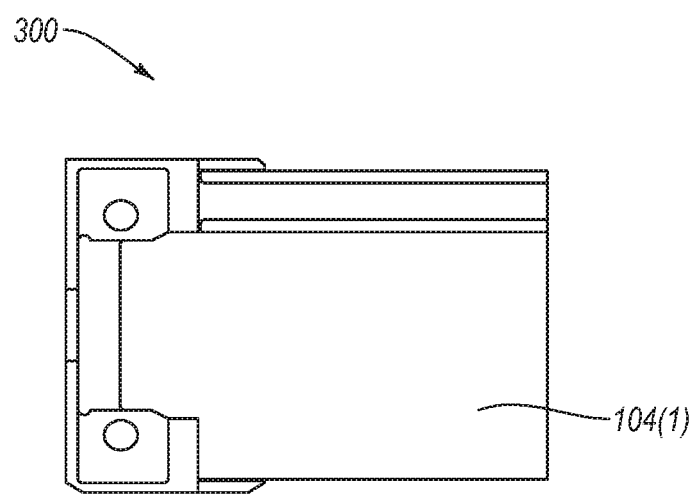
FIG. 3 is an illustration of an exemplary apparatus for increasing thermal mass in line card heatsinks.

FIG. 3 shows an exemplary apparatus 300 for achieving increased thermal mass in line card heatsinks. As illustrated in FIG. 3, exemplary apparatus 300 may include side rail 104(1) that is incorporated into faceplate 102 (not necessarily labeled in FIG. 3 due to the side-view angle). In this example, side rail 104(1) may be designed and/or intended to interface with an additional piece and/or segment that extends to a certain length to fit a particular sliding and/or track system. For example, an administrator or assembler may add an additional piece and/or segment to side rail 104(1) to fit the track system of a particular router. The administrator or assembler may add the additional piece and/or segment by attaching the same to side rail 104(1) with screws (such as helical screws).

Figure 4:
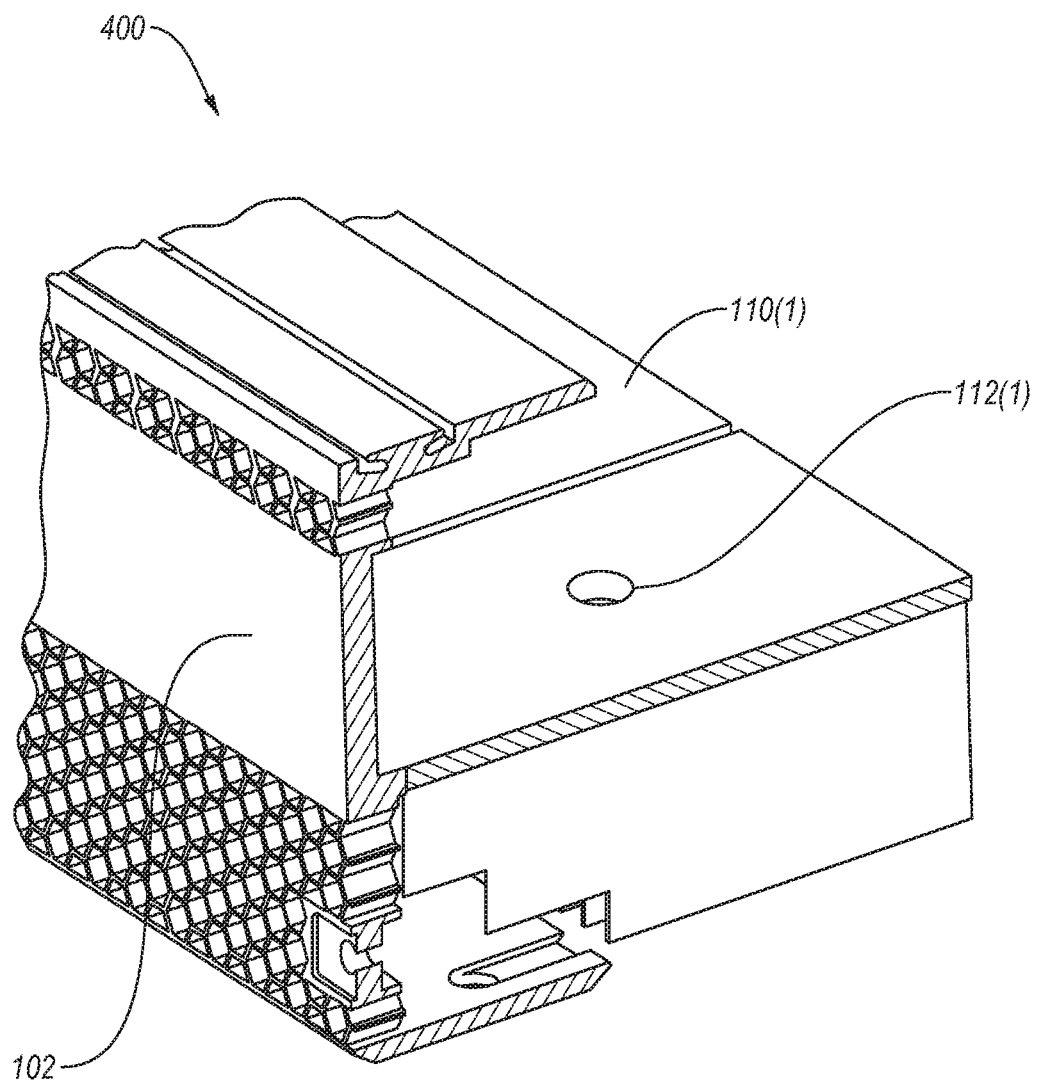
FIG. 4 is an illustration of an exemplary cross section of an apparatus for increasing thermal mass in line card heatsinks.

FIG. 4 shows a cross section of an exemplary apparatus 400 for increasing thermal mass in line card heatsinks. As illustrated in FIG. 4, exemplary apparatus 400 may include faceplate 102, heatsink 110(1), and mount 112(1). In this example, apparatus 400 may include and/or represent a single inseparable piece and/or member of a line card that incorporates faceplate 102, heatsink 110(1), and mount 112(1). Apparatus 400 may also include venting (not necessarily labeled in FIG. 4) that is embedded in faceplate 102 and enables ambient air to flow from outside of the line card to inside of the line card.

Figure 5:
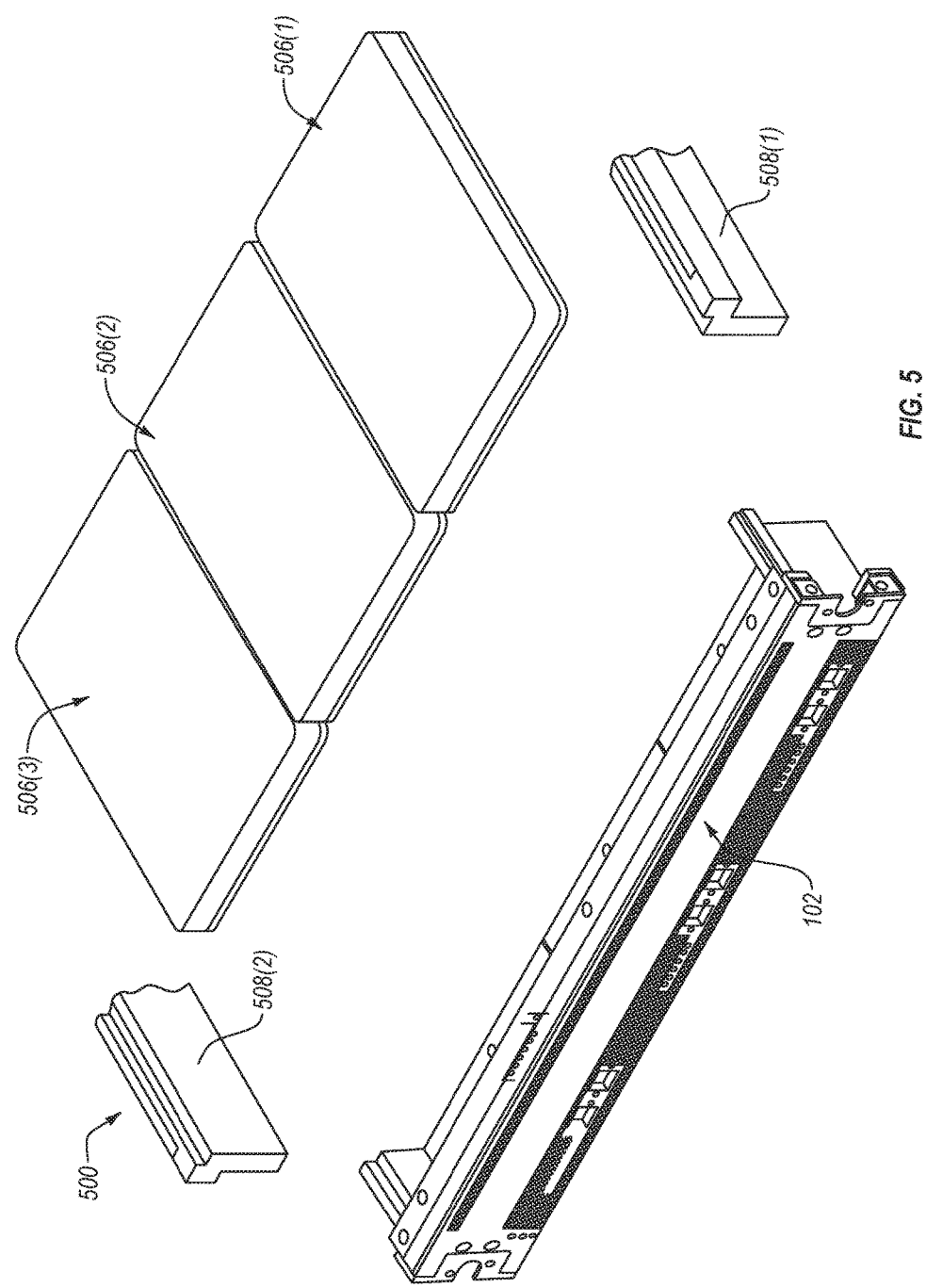
FIG. 5 is an illustration of an exemplary implementation of an apparatus for increasing thermal mass in line card heatsinks.

FIG. 5 shows an exemplary implementation of an apparatus for increasing thermal mass in line card heatsinks. As illustrated in FIG. 5, exemplary implementation 500 may include faceplate 102. In this example, faceplate 102 may include and/or incorporate heatsinks 110(1)-(3), side rails 104(1)-(2), and mounts 112(1)-(3) (although not necessarily labeled in FIG. 5). Exemplary implementation 500 may also include side rail extensions 508(1) and 508(2) that interface with and/or attached to side rails 104(1) and 104(2), respectively.

As illustrated in FIG. 5, exemplary implementation 500 may also include optics modules 506(1), 506(2), and 506(3). In this example, optics modules 506(1)-506(3) may attach and/or connect to heatsinks 110(1)-(3), respectively, by way of mounts 112(1)-(3). For example, an administrator or assembler may attach and/or connect optics modules 506 (1)-(3) to mounts 112(1)-(3) at heatsinks 110(1)-(3) with screws.

Since heatsinks 110(1)-(3) are integrated into faceplate 102, the heat generated by the optics modules 506(1)-(3) may dissipate throughout not only heatsinks 110(1)-(3) but also faceplate 102. As a result, the overall temperature of heatsinks 110(1)-(3) and optics modules 506(1)-(3) may stay lower and fail to reach the same levels as those in certain traditional line cards. Moreover, since side rails 104(1)-(2) are integrated into faceplate 102, EMI leaks may be avoided and/or fail to develop at gaps and/or spaces where such leaks have formed in certain traditional line cards.

While the foregoing disclosure sets forth various embodiments using specific illustrations and examples, each illustration component, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps and/or components described and/or illustrated herein are given by way of example only and can be varied as desired. For example, while the steps and/or components illustrated and/or described herein may be shown or discussed in a particular order, these steps and/or components do not necessarily need to be performed in the order illustrated or discussed. The various exemplary systems described and/or illustrated herein may also omit one or more of the steps and/or components described or illustrated herein or include additional steps and/or components in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a faceplate that:
        includes at least one communication port that facilitates at least one connection between at least one communication cable and a line card that forwards traffic in connection with a network; and
        is an external portion of the line card that is outward-facing and accessible when the line card is installed in a telecommunications device;
    at least one heatsink that:
        is integrated into the faceplate such that the heatsink and the faceplate collectively form a single inseparable piece of the line card; and
        absorbs heat emitted by at least one electronic component included in the line card; and
    at least one mount that:
        is integrated into the faceplate; and
        enables the electronic component to attach to the heatsink.

2. The apparatus of claim 1, further comprising at least a portion of a side rail that:
    is integrated into the faceplate; and
    physically supports the line card when installed in a telecommunications device included in the network.

3. The apparatus of claim 2, wherein the integration of the side rail and the faceplate prevents ElectroMagnetic Interference (EMI) from escaping from the line card.

4. The apparatus of claim 1, wherein the faceplate, the heatsink, and the mount collectively form the single inseparable piece of the line card.

5. The apparatus of claim 4, wherein the faceplate, the heatsink, and the mount are manufactured together as the single inseparable piece of the line card.

6. The apparatus of claim 1, wherein the heatsink makes physical contact with the electronic component to facilitate absorbing the heat from the electronic component such that the heat dissipates throughout the heatsink and the faceplate.

7. The apparatus of claim 1, wherein the faceplate comprises at least one vent that enables ambient air to flow from outside of the line card to inside of the line card.

8. The apparatus of claim 1, wherein the electronic component comprises an optics module that enables the line card to facilitate fiber-optic communication.

9. The apparatus of claim 1, wherein the communication port facilitates securing the communication cable to the line card to form the connection between the communication cable and the line card.

10. A faceplate comprising:
    at least one communication port that facilitates securing at least one communication cable to a line card that forwards traffic in connection with a network;
    at least one heatsink that:
        is integrated into the faceplate such that the heatsink and the faceplate collectively form a single inseparable piece of the line card; and
        absorbs heat emitted by at least one electronic component included in the line card;
    at least one mount that:
        is integrated into the faceplate; and
        enables the electronic component to attach to the heatsink; and
    wherein the faceplate is designed as an external portion of the line card that is outward-facing and accessible when the line card is installed in a telecommunications device.

11. The faceplate of claim 10, further comprising at least a portion of a side rail that physically supports the line card when installed in a telecommunications device.

12. The faceplate of claim 11, wherein the side rail is integrated into the faceplate such that the integration of the side rail and the faceplate prevents ElectroMagnetic Interference (EMI) from escaping from the line card.

13. The faceplate of claim 10, wherein the communication port, the heatsink, and the mount collectively form the single inseparable piece of the line card.

14. The faceplate of claim 13, wherein the communication port, the heatsink, and the mount are manufactured together as the single inseparable piece of the line card.

15. The faceplate of claim 10, wherein the heatsink makes physical contact with the electronic component to facilitate absorbing the heat from the electronic component such that the heat dissipates throughout the faceplate.

16. The faceplate of claim 10, further comprising at least one vent that enables ambient air to flow from outside of the line card to inside of the line card.

17. The faceplate of claim 10, wherein the electronic component comprises an optics module that enables the line card to facilitate fiber-optic communication.

18. An apparatus comprising:

a faceplate that:

includes at least one communication port that facilitates at least one connection between at least one communication cable and a line card that forwards traffic in connection with a network; and is an external portion of the line card that is outward-facing and accessible when the line card is installed in a telecommunications device;

at least one heatsink that:

is integrated into the faceplate such that the heatsink and the faceplate collectively form a single inseparable piece of the line card; and facilitates absorbing heat emitted by at least one electronic component included in the line card;

at least one mount that:

is integrated into the faceplate; and enables the electronic component to attach to the heatsink; and at least a portion of a side rail that:

is integrated into the faceplate; and physically supports the line card when installed in a telecommunications device included in the network.

\* \* \* \* \*